US005737262A

United States Patent [19]

Morgan

[11] Patent Number: 5,737,262
[45] Date of Patent: Apr. 7, 1998

[54] METHOD AND APPARATUS FOR AVOIDING BACK-TO-BACK DATA REWRITES TO A MEMORY ARRAY

[75] Inventor: Donald M. Morgan, Boise, Id.

[73] Assignee: Micron Technology, Inc., Boise, Id.

[21] Appl. No.: 694,293

[22] Filed: Aug. 8, 1996

[51] Int. Cl.⁶ .................................................. G11C 13/00
[52] U.S. Cl. .......................... 365/148; 365/100; 365/195
[58] Field of Search .................................. 365/100, 148, 365/195, 239, 230.08

[56] References Cited

U.S. PATENT DOCUMENTS

| 4,014,007 | 3/1977 | Groeger | 365/100 |
| 4,442,507 | 4/1984 | Roesner | 365/100 |
| 4,685,088 | 8/1987 | Iannucci | 365/195 |
| 4,795,657 | 1/1989 | Formigoni et al. | 365/100 |
| 5,097,445 | 3/1992 | Yamauchi | 365/195 |
| 5,406,509 | 4/1995 | Ovshinsky et al. | 365/163 |
| 5,493,665 | 2/1996 | Eisenberg | 365/195 |
| 5,541,869 | 7/1996 | Rose et al. | 365/100 |

Primary Examiner—David C. Nelms
Assistant Examiner—Michael T. Tran
Attorney, Agent, or Firm—Finnegan, Henderson, Farabow, Garrett & Dunner, L.L.P.

[57] ABSTRACT

In a memory system, a first write address is initially loaded into a first latch and transferred to a second latch. A second write address is then loaded into the first address latch. The two addresses are then compared and, if they differ, data associated with the first address is stored in a memory array. However, if the addresses are the same, it is assumed that the user intended to discard the first data associated with that address and this data is discarded rather than being stored in the array. After the comparison, the second address overwrites the first address in the second latch. A third write address is then loaded in the first latch. A comparison is made again, and data associated with the second address is stored in the array only if the second and third addresses are different, otherwise the original data associated with the second address is discarded. This process is repeated for each write address sent to the memory system.

24 Claims, 4 Drawing Sheets

METHOD AND APPARATUS FOR AVOIDING BACK-TO-BACK DATA REWRITES TO A MEMORY ARRAY

This invention was made with Government support under Contract No. MDA972-92-C-0054 awarded by the Advanced Research Projects Agency (ARPA). The Government has certain rights in this invention.

The present invention relates Random Access memories (RAMs), and particularly to Static Random Access Memories (SRAMs) and write circuitry for increasing the speed thereof.

BACKGROUND OF THE INVENTION

DRAM integrated circuit arrays have existed for more than twenty five years and have evolved from the earliest one kilobit (Kb) generation to the recent 256 megabit (Mb) generation. This dramatic increase in storage capacity has been achieved through advances in semiconductor fabrication technology and circuit design technology. The tremendous advances in these two technologies have also achieved higher and higher levels of integration that permit dramatic reductions in memory array size and cost, as well as increased process yield.

A DRAM memory cell typically comprises, as basic components, an access transistor (switch) and a capacitor for storing a binary data bit in the form of a charge. Typically, a charge of one polarity is stored on the capacitor to represent a binary ONE, and a stored charge of the opposite polarity represents a binary ZERO. The basic drawback of a DRAM is that the charge on the capacitor eventually leaks away and therefore provisions must be made to "refresh" the capacitor charge or else the data bit stored by the memory cell is lost.

The memory cell of a conventional SRAM, on the other hand, comprises, as basic components, an access transistor or transistors and a memory element in the form of two or more integrated circuit devices interconnected to function as a bistable latch. An example of such a bistable latch is cross-coupled inverters. Bistable latches do not need to be "refreshed", as in the case of DRAM memory cells, and will reliably store a data bit indefinitely as long as they continue to receive supply voltage.

Efforts continue to identify other forms of memory elements for use in SRAMs. Recent studies have focused on resistive materials that can be programmed to exhibit either high or low stable ohmic states. A memory element of such material could be programmed (set) to a high resistive state to store, for example, a ONE data bit or programmed to a low resistive state to store a ZERO data bit. The stored data bit could then be retrieved by detecting the magnitude of a readout current switched through the resistive memory element by an access device, thus indicating the stable resistance state it had previously been programmed to.

One particularly promising programmable, bistable resistive material is chalcogenide, such as the alloy system including Ge:Sb:Te disclosed in Ovshinsky et al., U.S. Pat. No. 5,414,271, the disclosure of which is incorporated herein by reference. A memory element comprised of a chalcogenide material can be programmed to a stable high resistive state by passing a narrow, high amplitude current pulse through it. A lower amplitude current pulse of longer duration programs a chalcogenide memory element to a stable, low resistive state. A chalcogenide memory element is simply written over by the appropriate current pulse to reprogram it, and thus does not need to be erased. Moreover, a memory element of chalcogenide material is nonvolatile, in that it need not be connected to a power supply to retain its programmed high or low resistive state.

It has, however, been discovered that chalcogenide material must be given a "cool down" or "rest" period of approximately 10 ns between successive writes. Accordingly, to insure that the same memory cell is not written twice within the cool down period, it is possible to adjust the system clock to a frequency such that the user's commands are performed at intervals at least equal to the cool down period. Unfortunately, this solution limits the speed at which the memory system can operate.

SUMMARY OF THE INVENTION

Selected embodiments in accordance with the present invention may have particular usefulness in increasing the speed of chalcogenide memories while providing a "cool down" period between successive writes to the same memory cell.

Additional advantages of the invention will be set forth in part in the description which follows, and in part will be obvious from the description, or may be learned by practice of the invention. The advantages of the invention will be realized and attained by means of the elements and combinations particularly pointed out in the appended claims.

In accordance with the purpose of the invention, as embodied and broadly described herein, the invention comprises a memory system including a plurality of memory cells, each of which storing information and having a respective address, and a first register sequentially receiving a first address and a second address, said first address having first data associated therewith and the second address having second data associated therewith. A second register is coupled to the first register and receives the first address prior to the first register receiving the second address, wherein the data associated with the first address is stored in a memory cell having the first address when the first address differs from the second address. Further, data is inhibited from being stored in the memory cell when the first and second addresses are the same.

It is to be understood that both the foregoing general description and the following detailed description are exemplary and explanatory only and are not restrictive of the invention, as claimed.

The accompanying drawings, which are incorporated in and constitute a part of this specification, together with the description, serve to explain the principles of the invention.

DESCRIPTION OF THE PREFERRED EMBODIMENT

Reference will now be made in detail to the present preferred embodiment of the invention, an example of which is illustrated in the accompanying drawings. Wherever possible, the same reference numbers will be used throughout the drawings to refer to the same or like parts.

In accordance with the present invention, a first write address to a memory cell of an array is loaded into a first address latch and then transferred to a second address latch. A second write address to a memory cell is then stored in the first address latch. The first and second write addresses are then compared and, if they are different, data associated with the first write address is stored in the array at the addressed memory cell. However, if the addresses are the same, it is assumed that the user intended to discard the first data associated with that address and thus it is not written to the addressed memory cell. Thus, the second write address overwrites the first address in the second latch. A third write address is then loaded in the first latch. A comparison is made again, and data is written to the memory cell having the second address only if the second and third addresses are different, otherwise the original data associated with the second address is discarded. This process is repeated for each successive write address sent to the memory system.

Thus, since data is not written to the same cell in successive clock cycles, the user can supply data, addresses and commands to the memory system at high clock rates and without the delay associated with the cool down period.

Figure 1:
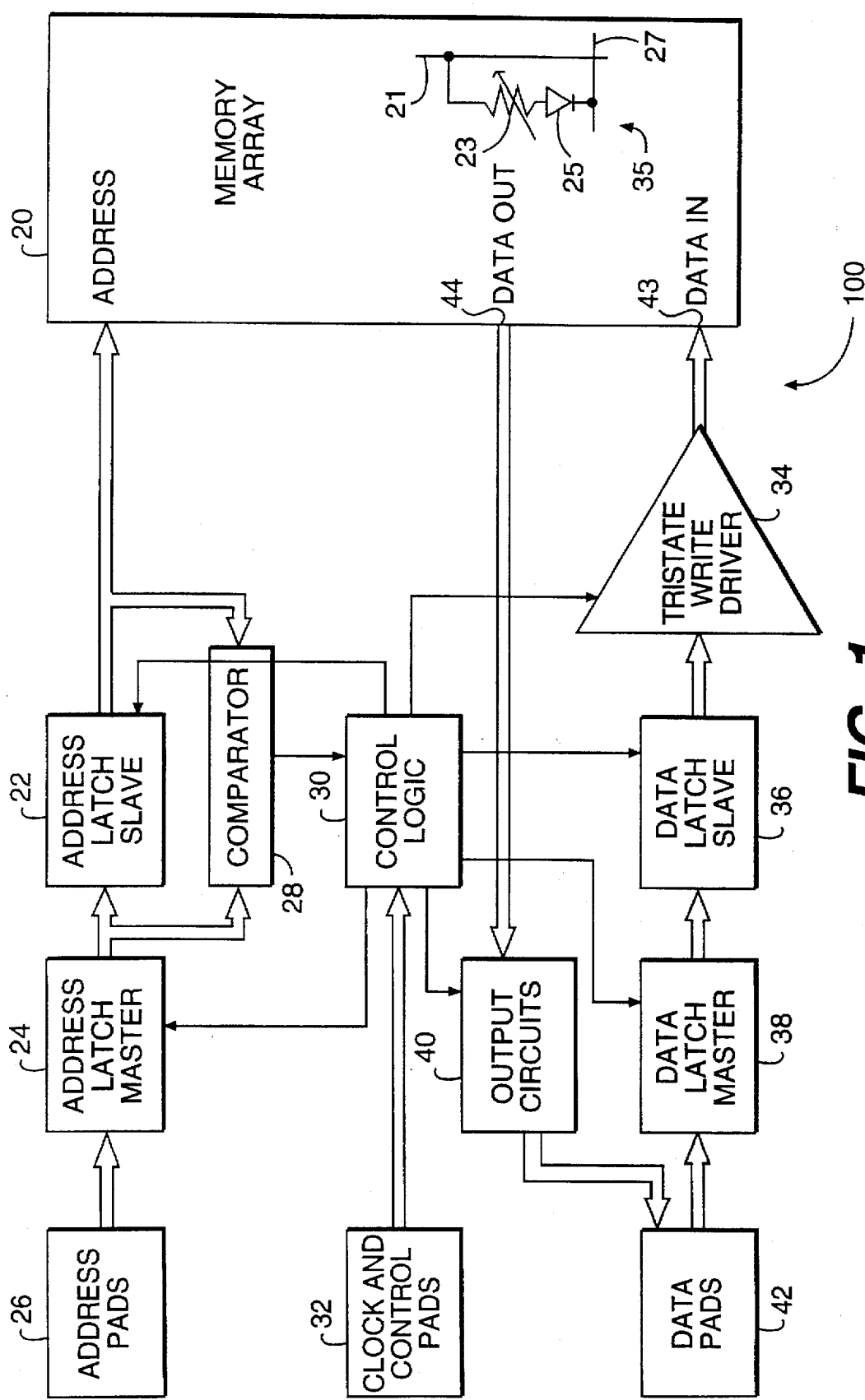
FIG. 1 is a schematic block diagram of a memory system, in accordance with the present invention.

FIG. 1 illustrates a schematic of memory system 100 in accordance with a preferred embodiment of the present invention. Memory system 100 includes a memory array 20 including a plurality of memory cells 35, each including a programmable resistor 23 preferably connected in series with a diode 25. Each memory cell 35 is connected to one of a plurality of row lines and one of a plurality of column lines for read/write access thereto. Addresses are supplied to memory array 20 from circuitry external to memory system 100 to access memory cells coupled to selected row and column lines. Once accessed, data can be either read from or written to the memory cells through data in and data out ports 43 and 44, respectively.

Addresses are supplied to the memory system 100 through address pads 26 and stored in address latch master 24, while data is supplied through data pads 42 to a first master data latch 38. The addresses and associated data are then successively copied from first or master latches 24 and 38 to second or slave latches 22 and 36 under control of control logic 30. Temporary storage circuits, preferably latches or registers 22 and 24, are further coupled to a comparator 28, which compares the addresses stored therein and supplies the result to control logic 30. Based on the comparison, control logic 30 determines whether the data stored in data slave 36 is to be written to array 20 at the address stored in latch 22.

Clock and control pulses are supplied to control logic 30 of memory system 100 through clock and control pads 32. In response to these signals, as well as the output from comparator 28, control logic 30 outputs signals for controlling the operation of latches 22 and 24, first data latch 38, second or slave data latch 36, as noted above, as well as output circuits 40, and write driver 34.

As further shown in FIG. 1, data is both written to array 20 from data pads 42 and read out from array 20 through the same data pads. Accordingly, it is possible for data to be inadvertently written to the array as it is being read out. In order to avoid this situation, array input circuit or write driver 34 preferably has a tristate output. That is, the output is either high, low or floating. As a result, write driver 34 can isolate itself from array 20, thereby preventing any data from being written to array 20 during a read.

Figure 2:
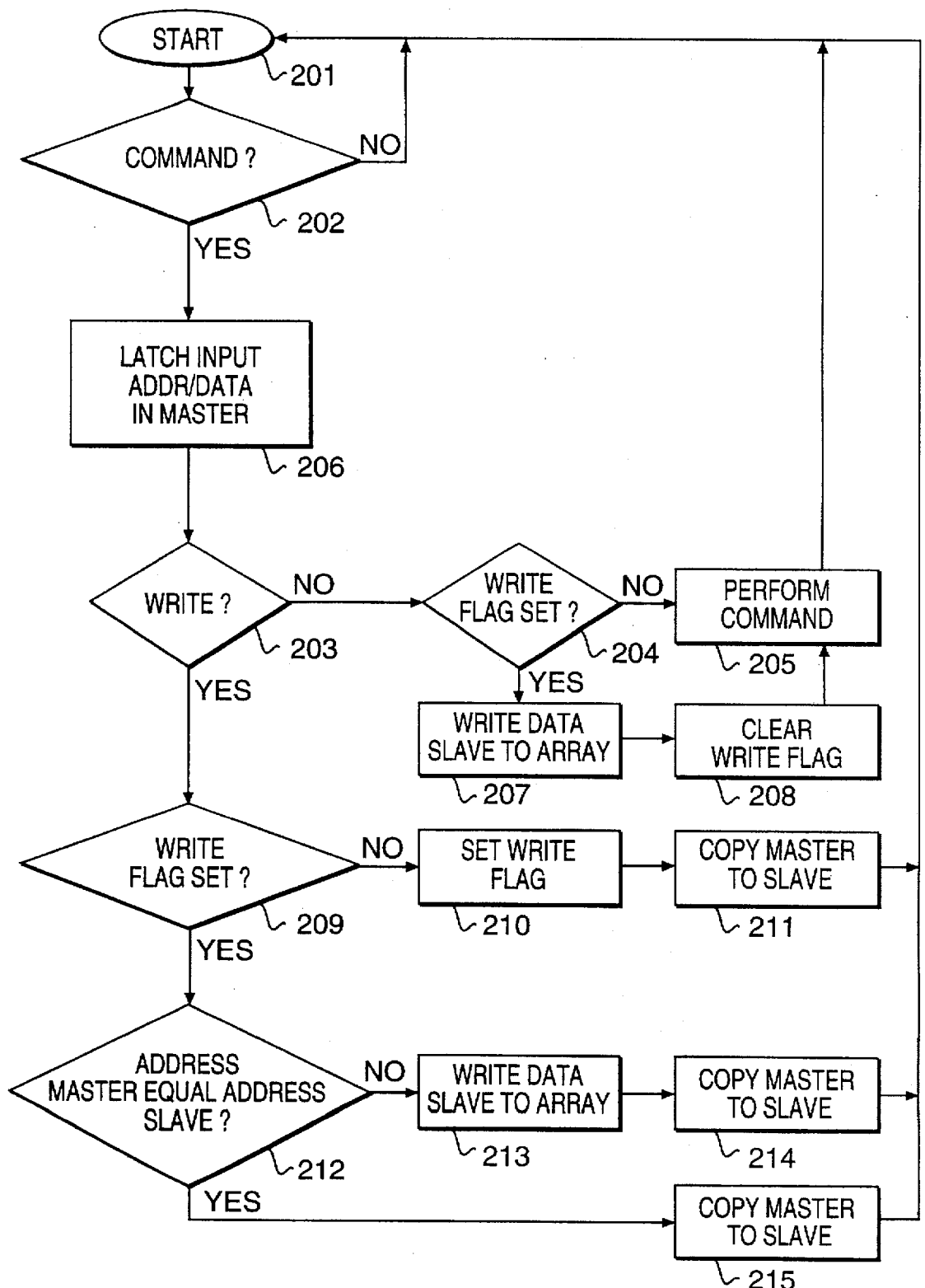
FIG. 2 is a flow chart illustrating the operation of the memory system shown in FIG. 1.

The operation of memory system 100 will be presented below with reference to flow chart 200 illustrated in FIG. 2. After performing appropriate initialization routines in a START step 201, control logic 30 first detects whether a command, preferably in the form of an opcode, has been input to memory system 100 in step 202, if not, control logic 30 returns to START step 201. If a command has been received, step 206 is performed, wherein address data is loaded into master latch 24 and corresponding data is loaded into master latch 38. Control logic 30 then proceeds to step 203 where a determination is made as to whether a write command has been received.

If a write command has been received, control logic 30 determines whether a write flag has been set step 209. The write flag is a storage bit which is set in response to receipt of a write command, and provides an indication that an outstanding write command exists that has not yet been executed. The steps in which the write flag is set and cleared will be further described below.

If the write flag has been set, control logic 30 ascertains in step 212 whether the address contained in master latch 24 is the same as that stored in slave latch 22 based on an output from comparator 28. If the two addresses are the same, control logic 30 generates signals to transfer the address and data information stored in master latches 24 and 38, respectively, to slave latches 22 and 36, respectively, in step 215, thereby overwriting the address and data in latches 22 and 36, respectively. Control logic 30 then returns to start step 201 without supplying signals to cause address and data in latches 22 and 36, respectively, to be supplied to memory array 20.

In this sequence of steps, a second write command is received after a first write command had been supplied to memory system 100, but not yet executed, as indicated by the write flag. Instead of successively writing to the same address, the memory system in accordance with the present invention overwrites the latches 22 and 36 with the second address and its associated data, respectively. Since the steps of overwriting data in the latches 22 and 36 can be performed quickly and with no cool down period within a given clock cycle, the speed of memory system 100 can be increased.

Returning to step 212, if the address contained in master latch 24 does not equal the address stored in slave latch 22, data contained in the slave latch 36 associated with the address present in slave latch 22 is written to array 20 at the specified memory cell address in step 213. Specifically, control logic 30 generates signals to cause the address in latch 22 to be supplied to memory array 20, and the data in latch 36 to be supplied to the array through write driver 34. The address in master latch 24 is then stored in slave latch 22 and corresponding data in master latch 38 is transferred to slave latch 36, both in step 214. Control logic 30 then returns to start step 201.

In step 209, if the write flag had not been set, then control logic 30 sets the write flag in step 210. In this case, a write command had been received, but no other unexecuted write commands were present. Proceeding to step 211, address and data in master latches 24 and 38 are next transferred to slave latches 22 and 36, respectively.

In step 203, if no write command has been received, a determination is made as to whether the write flag has been set. If not, then the command (e.g., a read) received in step 202 is performed in step 205 and control logic returns to start step 201. On the other hand, if the write flag had been previously set, i.e., an outstanding write command is present, then the data associated with that write command is stored in the array in step 207. The write flag is then cleared in step 208, indicating that the write command has been executed. The command received in step 202 is then performed in step 205 and control logic 30 again returns to start step 201.

Figure 3:
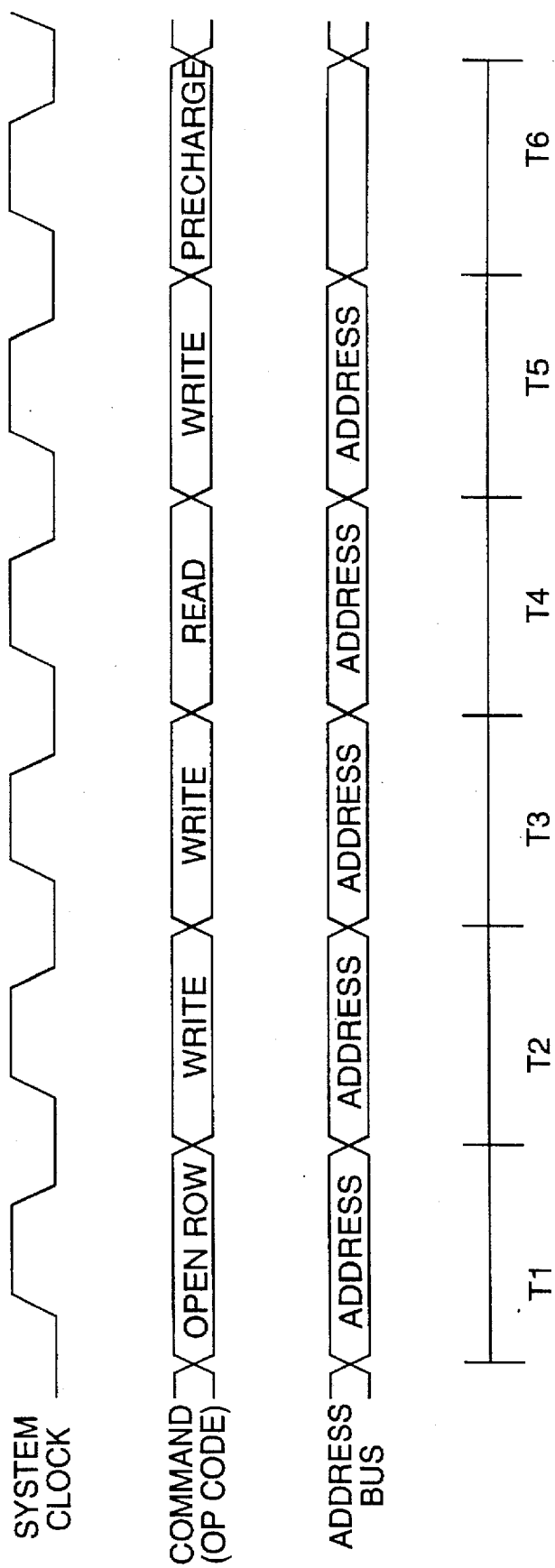
FIG. 3 is a timing diagram further illustrating an exemplary sequence of signals supplied to the memory system shown in FIG. 1.

The timing of the above-described operations performed by the memory system 100 relative to exemplary system clock, command and address signals will now be described with reference to FIG. 3. During a first system clock cycle, e.g. time period T1, in response to an "Open Row" command, a designated row within array 20 is selected and accessed. The write flag, however, is not set.

Next, during time period T2, in response to receipt of a write command (steps 201, 202), the first input address and data are respectively stored in master latches 24 and 38 (step 206). Further, during time period T2, after determining that a write command has been received, but the write flag remains clear (steps 203, 209), the write flag is set (step 210) and the first input address and data are stored in slave latches 22 and 36, respectively (step 211). The memory system then awaits another command by returning to start step 201.

The next command is received during time period T3. In the situation illustrated in FIG. 3, a second write command is received, and the second input address and data are supplied to master latches 24 and 38, respectively (steps 201, 202, 206 and 203), and, since the write flag has been previously set (step 209), a comparison is made between the addresses stored in master latch 24 and slave latch 22 (step 212). If the first and second addresses are different, the first input data in slave latch 36 is written to array 20 (step 213). The second input address and data are then transferred to slave latches 22 and 36, respectively (step 214).

During time period T4, a read command is supplied to memory system 100. The command is detected and the read address is stored in master latch 24 (steps 202, 206). The read command is also found not to be a write command (step 203), but the write flag is still set (from step 210 during time period T2). Accordingly, the second input data in slave latch 36 is written to array 20 at the second input address stored in slave latch 22 (step 207). The write flag is cleared (step 208), data is read from the read address memory cell in array 20 (step 205), and control logic again returns to start step 201.

During time period T5, an additional write command is received, which is detected (steps 202, 203), and third input address and data associated with the write command are supplied to master latches 24 and 38, respectively (step 206). Since the write flag was cleared during time period T4 (step 208), it is set (step 210) and the third input address and data are transferred to slave latches 22 and 36, respectively (step 211).

In the last time period of this example, T6, a precharge command is supplied to memory system 100, and is detected (step 202) by control logic 30. The precharge command does not require an address. Thus, whatever bits appearing at the address pads 26 are loaded to address master latch 24 (step 206). Since the precharge command is not a write command (step 203), a determination is made as to whether the write flag has been set (step 204). In this case, the write flag was previously set during time period T5, and, therefore, the third input data is written to array 20 from slave latch 36. The write flag is then cleared (step 208) and the precharge command is executed by releasing and precharging the rows of array 20.

Figure 4:
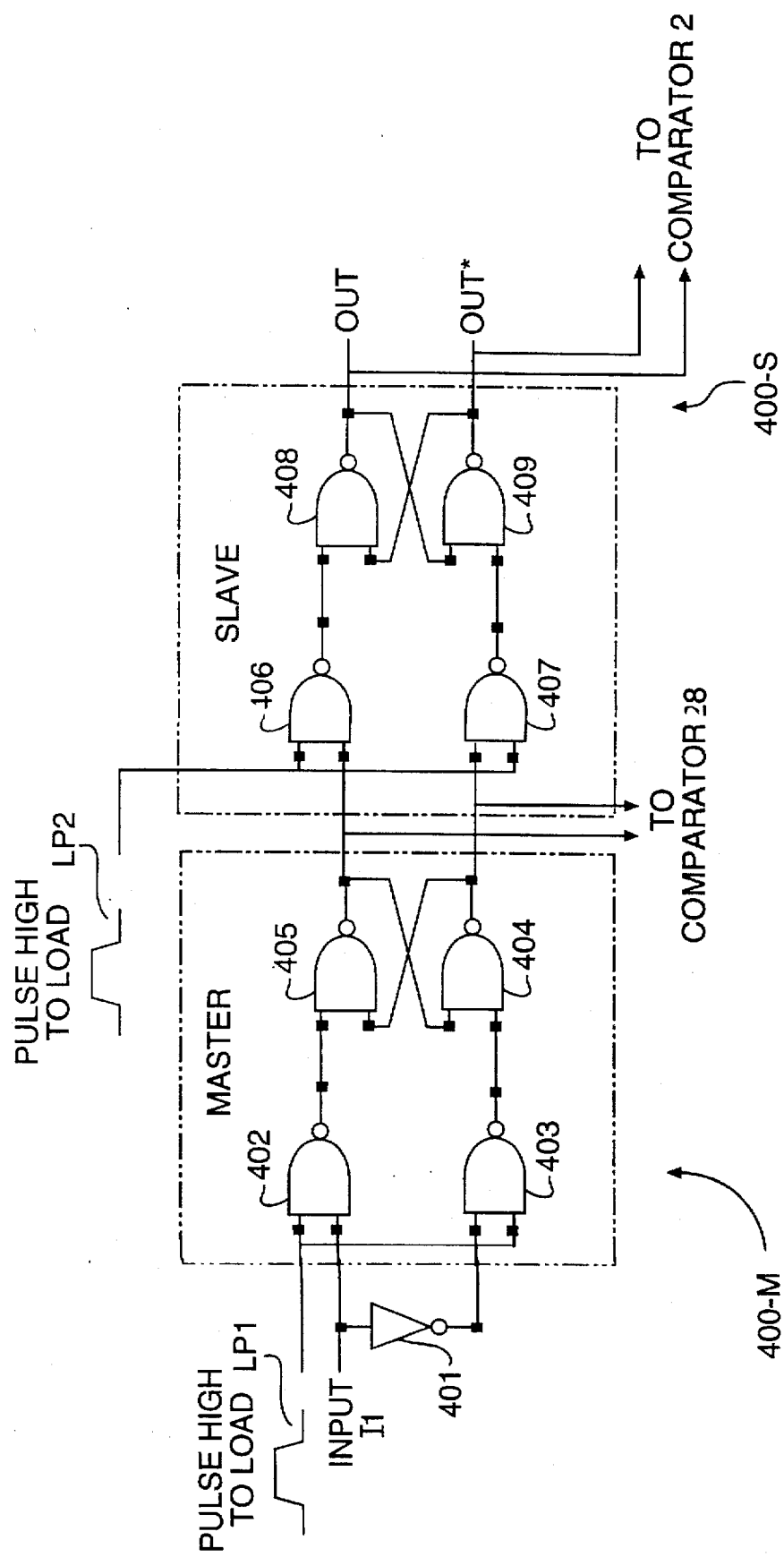
FIG. 4 is a detailed schematic of an exemplary latch circuit shown in FIG. 1.

Preferably, address/data master and slave latches shown in FIG. 1 include plural combinations of circuits 400-M and 400-S, respectively. As shown in FIG. 4, one combination of circuits 400-M and 400-S is provided for each address bit. In order to describe the operation of the circuitry shown in FIG. 4, it is assumed that a logic high is supplied to circuit 400-M at input terminal I1.

When a logic high load pulse LP1 is input to NAND gate 402 from control logic 30, a logic low is output. At the same time, a logic high is output from NAND gate 403. NAND gates 402 and 403 respectively supply their outputs to cross-coupled NAND gates 405 and 404, which output complementary high and low bits, respectively. As a result, the logic high address bit input to the circuit 400-M is represented by the latched complementary outputs of NAND gates 405 and 404. Conversely, a logic low address or data bit would be latched as a low output from NAND gate 405 and a high output from NAND gate 404.

When a logic high pulse LP2 is supplied from control logic 30 to the inputs of NAND gates 406 and 407 of slave latch 400-S, NAND gate 406 outputs a logic low and NAND gates 407 outputs a logic high. These outputs are received at respective inputs of cross-coupled NAND gates 408 and 409 to set nodes OUT and OUT* to logic high and low levels, respectively. Accordingly, the complementary outputs of circuit 400-M are transferred and latched at nodes OUT and OUT* of circuit 400-S, and then supplied to the memory array 20.

As noted above, each write address is latched and compared with a succeeding write address prior to writing data to the array to prevent back-to-back writes within the cool down period. Accordingly, although the actual writing of data to the array lags each write command by one clock cycle (assuming different successive write addresses), this lag is not seen by the user. Thus, the user can supply commands, addresses and data to the memory without cool down delays.

It will be apparent to those skilled in the art that various modifications and variations can be made in the memory system of the present invention and in construction of this memory system without departing from the scope or spirit of the invention. For example, although the invention has been described in conjunction with chalcogenide memories, it is equally applicable to any other memory which requires a delay between successive writes, for example, a single electron memory.

Other embodiments of the invention will be apparent to those skilled in the art from consideration of the specification and practice of the invention disclosed herein. It is intended that the specification and examples be considered as exemplary only, with a true scope and spirit of the invention being indicated by the following claims.

What is claimed is:

1. An integrated circuit memory comprising:
   a plurality of memory cells arranged in an array, each memory cell having a unique address in said array;
   a first latch circuit receiving a first address;
   a second latch circuit receiving first data to be written to a memory cell having said first address;
   a third latch circuit coupled to said first latch circuit and receiving said first address from said first latch circuit, whereupon said first latch circuit receives a second address;
   a fourth latch circuit coupled to said second latch circuit and receiving said first data from said second latch circuit, whereupon said second latch receives second data to be written to a memory cell having said second address; and a control circuit coupled to said first, second, third and fourth latch circuits, said control circuit writing said first data from said fourth latch to said memory cell having said first address when said first address in said first latch and said second address in said third latch are different, and inhibiting writing said first data to said memory cell having said first address when said first and second addresses are the same.

2. An integrated circuit memory in accordance with claim 1, wherein each of said plurality of memory cells includes a programmable resistor.

3. An integrated circuit memory in accordance with claim 2, wherein said programmable resistor includes a chalcogenide material.

4. An integrated circuit memory in accordance with claim 1, further comprising:

a comparator circuit coupled to said first latch circuit and said third latch circuit, said comparator circuit comparing said first address and said second address and supplying a comparison signal to said control circuit, said control circuit generating a control signal in response to said comparison signal; and an array input circuit coupled to said fourth latch circuit and said control circuit, said array input circuit receiving said first data and writing said first data to said memory cell having said first address in response to said control signal when said first and second addresses are different.

5. An integrated circuit memory system in accordance with claim 4, wherein said control circuit overwrites said first address in said third latch with said second address from said first latch, and said control circuit overwrites said first data in said fourth latch with said second data from said second latch.

6. A memory system comprising:

a plurality of memory cells, each having a unique address;

a first register sequentially receiving a first address and a second address, said first address having first data associated therewith and said second address having second data associated therewith;

a second register coupled to said first register and receiving said first address from said first register; and a storage control circuit storing said first data associated with said first address in a memory cell having said first address when said first address differs from said second address, and inhibiting storage of said first data in said memory cell when said first and second addresses are the same.

7. A memory system in accordance with claim 6, wherein each of said plurality of memory cells comprises a programmable resistor.

8. A memory system in accordance with claim 7, wherein said programmable resistor comprises a chalcogenide material.

9. A memory system in accordance with claim 6, further comprising a third register storing said first data, said storage control circuit comprising:

a comparator circuit coupled to said first register and said second register, said comparator circuit comparing said first address and said second address and generating a first signal when said first and second addresses are different and generating a second signal when said first and second addresses are the same, said storage control circuit being coupled to said third register, said storage control circuit further supplies a third signal to said third register to transfer said first data to said memory cell having said first address in response to said first signal, and said storage control circuit supplies a fourth signal to said third register to prevent said first data from being transferred to said memory cell having the first address in response to said second signal.

10. A memory system in accordance with claim 9, wherein said second data is stored in said third register after said storage control circuit generates either of said third and fourth signals.

11. A memory system in accordance with claim 9, wherein said first, second and third registers comprise latch circuits.

12. A method of operating a memory system including a plurality of memory cells, each having a unique address, said method comprising the steps of:

storing a first address in a first register;

storing a second address in a second register;

comparing said first and second addresses; and storing first data in a memory cell having said first address when said first address differs from said second address, and inhibiting storage of said first data in said memory cell when said first and second addresses are alike.

13. A method in accordance with claim 12, further comprising the steps of:

storing said first data in a third register during said step of storing said first address in said first register;

storing second data in a fourth register during said step of storing said second address in said second register; and after either said storing and inhibiting storage steps, storing second data in said third register; and storing said second address in said first register.

14. A method in accordance with claim 12, wherein said step of storing said first data in said memory cell includes the step of supplying a current to program a resistor to one of at least two stable resistance states.

15. A method in accordance with claim 12, further comprising a step of transferring said first address from said first register to a second register.

16. An integrated circuit memory comprising:

a plurality of memory cells arranged in an array, each memory cell having a unique address in said array;

a first temporary storage circuit sequentially receiving first and second addresses;

a second temporary storage circuit sequentially receiving first and second data to be written to ones of said plurality of memory cells at said first and second addresses, respectively;

a control circuit writing said first data to said one of said plurality of memory cells having said first address when said first and second addresses are different, and inhibiting writing said first data to said one of said plurality of memory cells having the first address when said first and second addresses are the same.

17. An integrated circuit memory in accordance with claim 16, wherein each of said plurality of memory cells includes a programmable resistor.

18. An integrated circuit memory in accordance with claim 17, wherein said programmable resistor includes a chalcogenide material.

19. An integrated circuit memory in accordance with claim 16, further comprising:

a comparator circuit coupled to said first temporary storage circuit, said comparator circuit comparing said first address and said second address and supplying a comparison signal to said control circuit, said control circuit generating a control signal in response to said comparison signal; and an array input circuit coupled to said second temporary storage circuit and said control circuit, said array input circuit receiving said first data and writing said first data to said memory cell having said first address in response to said control signal when said first and second addresses are different.

20. An integrated circuit comprising:

a first temporary storage circuit sequentially receiving first and second addresses;

a second temporary storage circuit sequentially receiving first and second data respectively associated with said first and second address; and a control circuit transferring said first data from said second temporary storage circuit when said first and second addresses are different, and inhibiting transfer of said first data from said second temporary storage circuit when said first and second addresses are the same.

21. An integrated circuit in accordance with claim 20, further comprising:

a plurality of memory cells coupled to receive said first data from said second temporary storage circuit.

22. An integrated circuit memory in accordance with claim 21, wherein each of said plurality of memory cells includes a programmable resistor.

23. An integrated circuit memory in accordance with claim 22, wherein said programmable resistor includes a chalcogenide material.

24. An integrated circuit memory in accordance with claim 22, further comprising:

a comparator circuit coupled to said first temporary storage circuit, said comparator circuit comparing said first address and said second address and supplying a comparison signal to said control circuit, said control circuit generating a control signal in response to said comparison signal; and an array input circuit coupled to said second temporary storage circuit and said control circuit, said array input circuit receiving said first data and writing said first data to a memory cell having said first address in response to said control signal when said first and second addresses are different.

* * * * *

UNITED STATES PATENT AND TRADEMARK OFFICE
CERTIFICATE OF CORRECTION

| | |
|---|---|
| PATENT NO. : 5,737,262 | Page 1 of 1 |
| DATED : April 7, 1998 | |
| INVENTOR(S) : Donald M. Morgan | |

It is certified that error appears in the above-identified patent and that said Letters Patent is hereby corrected as shown below:

Column 1,
Line 8, insert -- GOVERNMENT RIGHTS
This invention was made with United States Government support under contract No. DABT63-97-C-0001 awarded by the Advance Research Projects Agency (ARPA). The United States Government has certain rights in this invention. --

Signed and Sealed this

Twenty fifth Day of September, 2001

*Attest:*

*Attesting Officer*

NICHOLAS P. GODICI
*Acting Director of the United States Patent and Trademark Office*